(12) United States Patent
Oh et al.

(10) Patent No.: US 8,884,290 B2
(45) Date of Patent: Nov. 11, 2014

(54) THIN FILM TRANSISTOR ARRAY PANEL, DISPLAY DEVICE INCLUDING THE PANEL, AND METHOD FOR MANUFACTURING THE DISPLAY DEVICE

(75) Inventors: Keun-Chan Oh, Chungcheongnam-do (KR); Yong-Kuk Yun, Gyeonggi-do (KR); Woo-Jin Bae, Seoul (KR)

(73) Assignee: Samsung Display Co., Ltd. (KR)

( * ) Notice: Subject to any disclaimer, the term of this patent is extended or adjusted under 35 U.S.C. 154(b) by 1070 days.

(21) Appl. No.: 11/939,175

(22) Filed: Nov. 13, 2007

(65) Prior Publication Data
US 2008/0272375 A1   Nov. 6, 2008

(30) Foreign Application Priority Data

May 2, 2007   (KR) ........................ 10-2007-0042767

(51) Int. Cl.
| | | |
|---|---|---|
| *H01L 29/04* | (2006.01) | |
| *H01L 29/10* | (2006.01) | |
| *H01L 31/00* | (2006.01) | |
| *G02F 1/1347* | (2006.01) | |
| *H01L 27/12* | (2006.01) | |
| *G02F 1/1362* | (2006.01) | |

(52) U.S. Cl.
CPC ........ *G02F 1/13471* (2013.01); *H01L 27/1214* (2013.01); *G02F 1/1362* (2013.01); *H01L 27/12* (2013.01)
USPC   257/59; 257/72; 257/E29.117; 257/E51.005; 349/74; 349/77; 349/81

(58) Field of Classification Search
CPC ............ H01L 27/3267; H01L 27/3286; H01L 27/1214; G02F 1/13471

USPC .................... 257/61, 66, 52, 57, 72, E51.005, 257/E29.117, 88, 89; 345/1.1, 1.3, 80, 205, 345/206; 349/74, 77, 81

See application file for complete search history.

(56) References Cited

U.S. PATENT DOCUMENTS

| | | | |
|---|---|---|---|
| 5,729,307 A | 3/1998 | Koden et al. | |
| 5,801,799 A | 9/1998 | Chen et al. | |
| 6,346,730 B1 * | 2/2002 | Kitakado et al. | 257/350 |
| 6,844,957 B2 | 1/2005 | Matsumoto et al. | |
| 7,301,171 B2 * | 11/2007 | Osame et al. | 257/59 |
| 2003/0227254 A1 * | 12/2003 | Terumoto | 313/504 |
| 2005/0024339 A1 * | 2/2005 | Yamazaki et al. | 345/169 |
| 2005/0194889 A1 * | 9/2005 | Chen et al. | 313/495 |

FOREIGN PATENT DOCUMENTS

| | | |
|---|---|---|
| JP | 5273576 | 10/1993 |
| JP | 2000111940 | 4/2000 |
| JP | 2000227606 | 8/2000 |
| JP | 200166626 | 3/2001 |
| JP | 2001109012 | 4/2001 |
| JP | 2004258372 | 9/2004 |
| JP | 2005-308848 A | 4/2005 |
| JP | 3791804 B2 | 6/2006 |
| KR | 19990033502 | 5/1999 |
| KR | 1020050107465 A | 11/2005 |
| KR | 1020060096638 | 9/2006 |

* cited by examiner

*Primary Examiner* — Jesse Y Miyoshi
(74) *Attorney, Agent, or Firm* — Cantor Colburn LLP

(57) ABSTRACT

A thin film transistor array panel, a display device including the thin film transistor array panel, and a method for manufacturing the display device. The thin film transistor array panel includes a substrate having first and second surfaces, a first thin film form formed on the first surface and including a first electrode, and a second thin film form formed on the second surface and including a second electrode, to thereby improve the viewing angle and contrast ratio of the display device.

20 Claims, 6 Drawing Sheets

THIN FILM TRANSISTOR ARRAY PANEL, DISPLAY DEVICE INCLUDING THE PANEL, AND METHOD FOR MANUFACTURING THE DISPLAY DEVICE

This application claims priority to Korean Patent Application No. 10-2007-0042767, filed on May 2, 2007, and all the benefits accruing therefrom under 35 U.S.C. §119, the contents of which in its entirety are herein incorporated by reference.

BACKGROUND OP THE INVENTION

1. Field of the Invention

The present invention relates to a thin film transistor array panel, a display device including the same, and a method for manufacturing the display device.

2. Description of the Related Art

A liquid crystal display ("LCD"), a plasma display panel ("PDF"), a flat emission display ("FED"), a vacuum fluorescent display ("VFD"), and an organic light emitting device ("OLED") are among widely used flat panel displays.

Currently, the LCD is one of the most common. An LCD includes two panels provided with field-generating electrodes, such as pixel electrodes and a common electrode, and a liquid crystal ("LC") layer interposed therebetween. The LCD displays images by applying voltages to the field-generating electrodes to generate an electric field in the LC layer, which determines orientations of LC molecules in the LC layer to adjust polarisation of incident light.

Some characteristics of the LCD are a viewing angle and contrast ratio changed according to the viewing angle. The maximum luminance is displayed perpendicular to the surface of the screen and the luminance is gradually reduced according to an increasing inclination of the viewing angle for the screen. A reference viewing angle is defined as a viewing angle making the contrast ratio equal to or more than a reference value, and a wide reference viewing angle must be obtained to see normal images with a wider angle. Accordingly, it is important to increase the reference viewing angle and the contrast ratio to improve the characteristics of the LCD.

BRIEF SUMMARY OF THE INVENTION

The present invention has been made in an effort to solve the above-stated problems, and aspects of the present invention provide a thin film transistor array panel, a display device including the same, and a method for manufacturing the display device having a wide viewing angle as well as a high contrast ratio.

In an exemplary embodiment the present invention provides a thin film transistor array panel which includes a substrate having first and second surfaces, a first thin film form formed on the first surface and including a first electrode, and a second thin film form formed on the second surface and including a second electrode.

In an exemplary embodiment, the first and second thin film forms respectively include a gate electrode, a gate insulating layer covering the gate electrode, a semiconductor layer formed on the gate insulating layer, a source electrode formed on the semiconductor layer, and a drain electrode formed on the semiconductor layer and separated from the source electrode.

In an exemplary embodiment, the first thin film form further includes a passivation layer formed on the semiconductor layer, and a polarizer formed on the passivation layer.

In an exemplary embodiment, the first electrode is disposed between the passivation layer and the polarizer and is connected to the drain electrode.

In an exemplary embodiment, the substrate includes a polarizer which includes a lattice pattern of minute lines.

In another exemplary embodiment, the first and second thin film forms include symmetry with the reference of the substrate.

In another exemplary embodiment, the present invention provides a display device which includes a first substrate having first and second surfaces, a first thin film layer formed on the first surface, a second thin film layer formed on the second surface, a second substrate facing the first thin film form, and a third substrate facing the second thin film form.

In an exemplary embodiment, the first and second thin film forms respectively include a gate electrode, a gate insulating layer covering the gate electrode, a semiconductor layer formed on the gate insulating layer, a source electrode formed on the semiconductor layer, and a drain electrode formed on the semiconductor layer and separated from the source electrode.

In an exemplary embodiment, the display device further includes a polarizer formed between the first thin film form and the second substrate.

In an exemplary embodiment, the first substrate includes a polarizer which includes a lattice pattern of minute lines.

In an exemplary embodiment, the display device further includes first and second common electrodes, respectively formed on the second and third substrates.

In an exemplary embodiment, the display device further includes a color filter which is formed on the third substrate and displays color.

In an exemplary embodiment, the display device further includes first and second liquid crystal layers respectively formed between the first substrate and the second and third substrates.

In an exemplary embodiment, the display device further includes first and second flexible printed circuits respectively attached to the first and second surfaces of the first substrate, and an integrated circuit chip connected to the first and second flexible printed circuits.

In another exemplary embodiment, the display device further includes a first flexible printed circuit attached to the first surface of the first substrate, a second flexible printed circuit attached to the second surface of the first substrate and connected to the first flexible printed circuit, and an integrated circuit chip connected to the first flexible printed circuit.

In another exemplary embodiment, the present invention provides a manufacturing method for a display device the method including forming a first thin film transistor on a first surface of a first substrate, forming a second thin film farm on a second surface of the first substrate to form a first panel, forming a second panel facing the first thin, film form, forming a third panel facing the second thin film form, and forming first and second liquid crystal layers respectively formed between the second and third panels and tire first panel.

In an exemplary embodiment, forming the first and second thin film layers includes simultaneously forming the first and second thin film forms.

In an exemplary embodiment, the method further includes connecting a first output terminal of an integrated circuit chip to the first thin film layer, and connecting a second output terminal of the integrated circuit chip to the second thin film form.

In another exemplary embodiment, the present invention provides a manufacturing method for a display device, the method including forming a first thin film form on a first surface of a first substrate, forming a second thin film form on a second surface of the first substrate, to form a first panel, forming a first liquid crystal layer on the first thin film form of the first panel or a second panel, combining the first panel and the second panel via the first liquid crystal layer, forming a second liquid crystal layer on the second thin film form of the first panel or a third panel, and combining the first panel and the third panel via the second liquid crystal layer.

In an exemplary embodiment, forming the first and second thin film forms includes simultaneously forming the first and second thin film forms.

In art exemplary embodiment, the method further includes connecting a first output terminal of an integrated circuit to the first thin film form, and connecting a second output terminal of the integrated circuit chip to the second thin film form.

BRIEF DESCRIPTION OF THE DRAWINGS

The above and/or other aspects, features, and advantages of the present invention will become more apparent from the following detailed description when taken in conjunction with the accompanying drawings, in which.

DETAILED DESCRIPTION OF THE INVENTION

Figure 1:
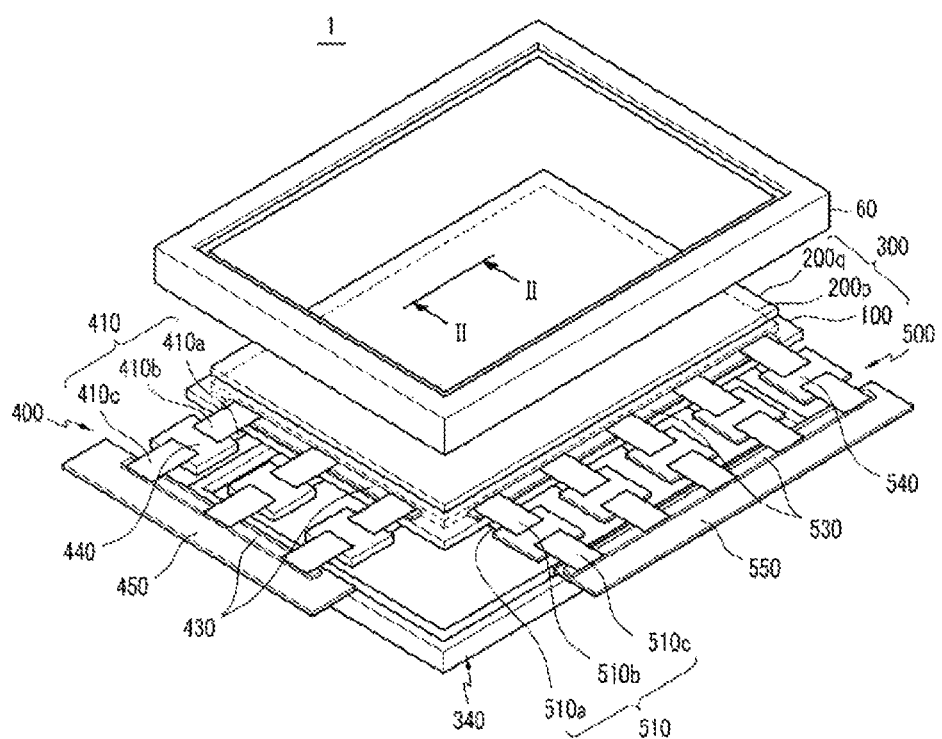
FIG. 1 is a perspective view illustrating an exemplary embodiment of a display device according to the present invention.

The present invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers, films, and regions are exaggerated for clarity.

It will be understood that when an element or layer is referred to as being "on," "connected to" or "coupled to" another element or layer, it can be directly on, connected or coupled to the other element or layer or intervening elements may be present, in contrast, when an element is referred to as being "directly on," "directly connected to" or "directly coupled to" another element or layer, there are no intervening elements or layers present. Like numbers refer to like elements throughout. As used herein, the terms "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the Figures. For example, if the device in the figures is turned over, elements described as "below" or "lower" other elements or features would then be oriented "above" or "upper" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the contest of the relevant art and will not be interpreted in an idealised or overly formal sense unless expressly so defined herein.

Hereinafter, the present invention will be explained in detail with reference to the accompanying drawings.

A thin film transistor array panel and a display device including the same according to an exemplary embodiment of the present invention will be described in detail with reference to FIGS. 1 through 5b.

Figure 2:
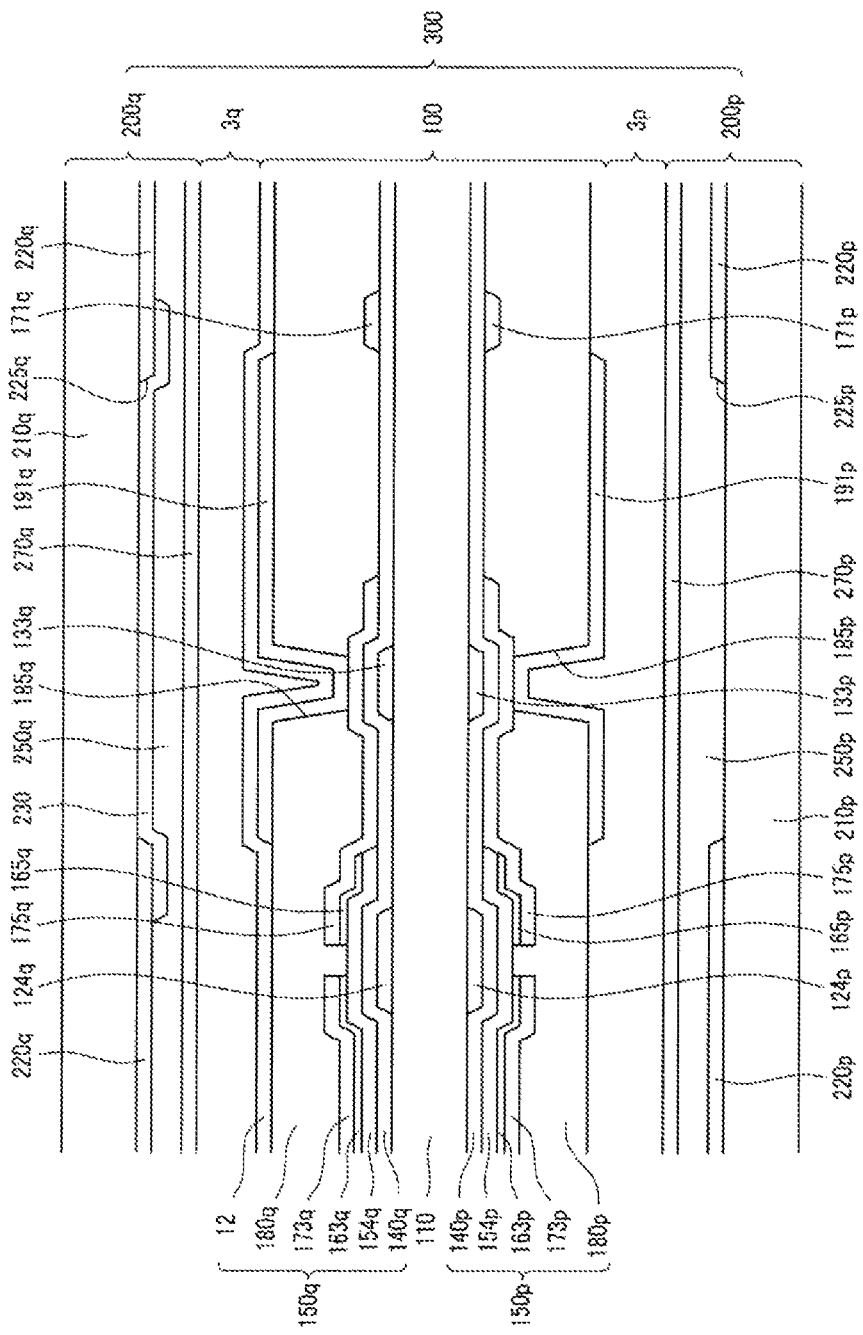
FIG. 2 is a cross-sectional view illustrating an exemplary embodiment of the display panel assembly shown in FIG. 1 taken along the line II-II.
Figure 3:
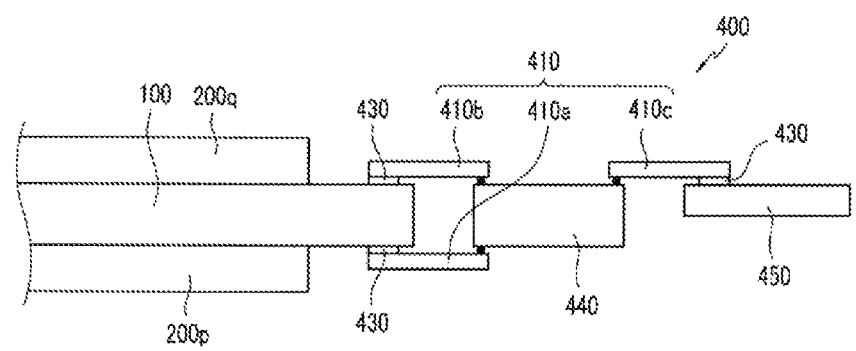
FIG. 3 is a lateral view illustrating an exemplary embodiment of the display panel assembly and the gate driver shown in FIG. 1.
Figure 4:
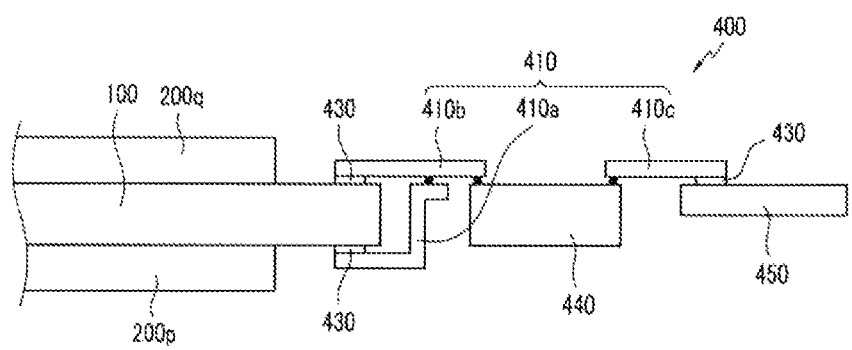
FIG. 4 is a lateral view illustrating another exemplary embodiment of a display panel assembly and a gate driver according to the present invention.
Figure 5A:
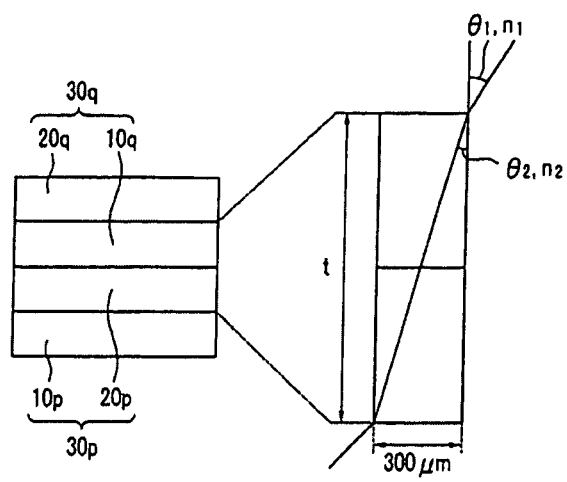
FIGS. 5A and 5B are schematic views illustrating viewing angle characteristics of a conventional display device and the display device according to an exemplary embodiment of the present invention.
Figure 5B:
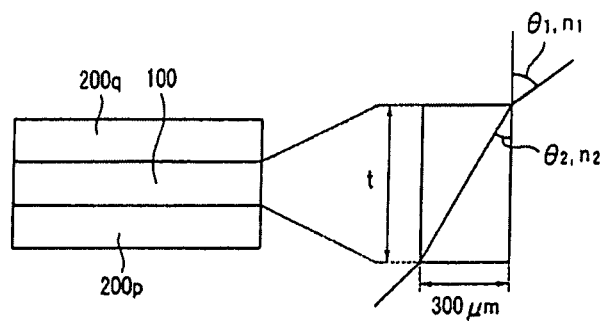

FIG. 1 is a perspective view illustrating an exemplary embodiment of a display device according to the present invention, FIG. 2 is a cross-sectional view illustrating an exemplary embodiment of the display panel assembly shown in FIG. 1 taken along the line II-II, FIG. 3 is a lateral view illustrating an exemplary embodiment of the display panel assembly and the gate driver shown in FIG. 1, FIG. 4 is a lateral view illustrating another exemplary embodiment of a display panel assembly and a gate driver according to the present invention, and FIGS. 5A and 5B are schematic views illustrating viewing angle characteristics of a conventional display device and the display device according to an exemplary embodiment of the present invention.

Referring to FIGS. 1 through 4, in an exemplary embodiment, the present invention provides a display device 1 which includes a display panel assembly 300, a gate driver unit 400, a data driver unit 500, a backlight assembly 340, and a top chassis 60.

Referring to FIGS. 1 and 2, according to an exemplary embodiment, the display panel assembly 300 includes a thin film transistor array panel 100, a lower display panel 200*p*, an upper display panel 200q, a lower liquid crystal layer 3p, and an upper liquid crystal layer 3q.

According to an exemplary embodiment, the thin film transistor array panel 100 includes a substrate 110 and a pair of thin film forms 150p and 150q.

According to an exemplary embodiment, the substrate 110 is made of a transparent insulating material such as transparent glass or plastic. The lower thin film form 150p and the upper thin film form 150q are respectively formed on the lower and the upper surfaces of the substrate 110. The lower thin film form 150p and the upper thin film form 150q have a same or similar structure to each other and symmetry with reference to the substrate 110. However, according to another exemplary embodiment, the lower thin film form 150p and the upper thin film form 150q may not have symmetry with reference to the substrate 310.

A description of the upper and the lower thin film forms 150p and 150q follows in detail with reference to the drawings.

According to an exemplary embodiment, a gate conductor including a plurality of gate lines (not shown) and a plurality of storage electrodes 133p and 133q are respectively formed on the upper and lower surfaces of the substrate 110.

According to an exemplary embodiment, the gate lines transmit gate signals and include a plurality of projections forming a plurality of gate electrodes 124p and 124q, and end portions having a large area for contact with another layer or the gate driver unit 400. The storage electrodes 133p and 133q supplied with a predetermined voltage are separate from the gate lines.

According to an exemplary embodiment, gate insulating layers 140p and 140q are respectively formed on the gate conductor.

According to an exemplary embodiment a plurality of semiconductors 154p and 154q made of hydrogenated amorphous silicon ("a-Si") or polysilicon, and a plurality of ohmic contacts 163p, 163q, 165p, and 165q made of silicide or n+ hydrogenated a-Si heavily doped with an n-type impurity such as phosphorous are sequentially and respectively formed on the gate insulating layers 140p and 140q. The ohmic contacts 163p, 163q, 165p, and 165q are respectively located in pairs on the semiconductors 154p and 154q.

According to an exemplary embodiment a plurality of data lines 171p and 171q and a plurality of drain electrodes 175p and 175q separated from the data lines 171p and 171q are respectively formed on the ohmic contacts 163p, 163q, 165p, and 165q and the gate insulating layers 140p and 140q.

According to an exemplary embodiment, the data lines 171p and 171q transmit data voltages and include a plurality of source electrodes 173p and 173q, which are extended toward the gate electrodes 124p and 124q, and end portions (not shown) having a large area for contact with another layer or the data driver unit 400. The source electrodes 173p and 173q face the drain electrodes 175p and 175q with reference to the gate electrodes 124p and 124q.

In an exemplary embodiment, the gate electrodes 124p and 124q, the source electrodes 173p and 173q, and the drain electrodes 175p and 175q along with the semiconductors 154p and 154q respectively form thin film transistors ("TPTs") having a channel formed in the semiconductors 154p and 154q respectively disposed between the source electrodes 173p and 173q, and the drain electrodes 175p and 175q.

The ohmic contacts 163p, 163q, 165p, and 165q are interposed only between the underlying semiconductors 154p and 154q, and the overlying data lines 171p and 171q and drain electrodes 175p and 175q thereon, and reduce the contact resistance therebetween. The semiconductors 154p and 154q include a plurality of exposed portions that are not covered with the data lines 171p and 171q and the drain electrodes 175p and 175q, such as portions located between the source electrodes 173p and 173q and the drain electrodes 175p and 175q.

In an exemplary embodiment, passivation layers 180p and 180q are respectively formed on the data lines 171p and 171q, the drain electrodes 175p and 175q, the gate insulating layers 140p and 140q, and the exposed portions of the semiconductors 154. According to an exemplary embodiment, the passivation layers 180p and 180q are made of a single-layered structure, but may include a lower film of an inorganic insulator and an upper film of an organic insulator.

The passivation layer 180 includes a plurality of contact holes 185p and 185q exposing the portions of the drain electrodes 175p and 175q, respectively. According to art exemplary embodiment, the passivation layers 180p and 180q and the gate insulating layers 140p and 140q may have a plurality of contact holes exposing the end portions (not shown) of the gate lines (not shown) and the data lines 171p and 171q.

A plurality of pixel electrodes 191p and 191q are disposed on the passivation layers 180p and 180q. In an exemplary embodiment, the pixel electrodes 191p and 191q are made of a transparent conductor such as indium tin oxide ("ITO") or indium zinc oxide ("IZO").

In an exemplary embodiment, a plurality of contact assistants may be formed on the passivation layers 180p and 180q. In an exemplary embodiment, the contact assistants may be connected to the end portions of the gate lines and the end portions of the data lines 171p and 171q through the contact holes, respectively. The contact assistants protect the end portions and complement the adhesion of the end portions and external devices.

An upper polarizer 12 is formed on upper surfaces of pixel electrodes 191q which polarizes the incident light. According to an exemplary embodiment, the upper polarizer 12 may be disposed on the lower surface of the substrate 110, and may be disposed directly on the substrate 110 or other layers. According to an exemplary embodiment when forming the polarizer 12 directly on the substrate 110, minute lines, formed of a material such as aluminum, may include a lattice pattern.

A description of the upper display panel 200q and the lower display panel 200p follows with reference to the drawings.

The upper display panel 200q faces the upper thin film form 150q of the thin film transistor array panel 100, and the lower display panel 200p faces the lower thin film form 150p of the thin film transistor array panel 100. An upper liquid crystal layer 3q is formed between the upper display panel 200q and the upper thin film form 150q, and a lower liquid crystal layer 3p is formed between the lower display panel 200p and the lower thin film form 150p. Here, at least one of the upper and lower display panels 200q and 200p may include a polarizer (not shown).

In the upper and lower display panels 200q and 200p, light blocking members 220p and 220q, referred to as "a black matrix", which prevent light leakage are formed on insulating substrates 210p and 210q. The light blocking members 220p and 220q include a plurality of openings 225p and 225q which face the pixel electrodes 191 and have substantially the same planar shape as the pixel electrodes 191p and 191q, and prevent light leakage between the pixel electrodes 191p and 191q.

Overcoats 250p and 250q are formed on the insulating substrates 210p and 210q and the light blocking members 220p and 220q. According to an exemplary embodiment the overcoats 250p and 250q are made of an (organic) insulator, and also provide a Hat surface. The present invention is not limited hereto. Thus, the overcoats 250p and 250q may be omitted.

Common electrodes 270p and 270q, made of a transparent material such as indium tin oxide ("ITO") or indium seine oxide ("IZO"), are respectively formed on the overcoats 250p and 250q.

A plurality of color filters 230 are also formed between the upper insulating substrate 210q and the upper overcoat 250q, and the upper overcoat 250q prevents the color filters 230 from being exposed. The color filters 230 are disposed substantially in the openings 225q enclosed by the light blocking member 220q. Each of the color filters 230 represents one primary color, such as red, green, or blue. The color filters 230 are not formed on the lower insulating substrate 210p of the lower panel 200p.

As described above, the display device includes a double display panel structure. Therefore, although leakage light is generated in a lower display panel under a black state, the leakage light is blocked by the upper display panel. Accordingly, luminance may be remarkably decreased in the black state. That is, because the light passes through the double display panel structure, the luminance may be decreased. Because the rate of decreasing of the black luminance is larger, the contrast ratio may be increased.

Referring to FIGS. 1, 3, and 4, the gate driver unit 400 and the data driver unit 500 respectively include flexible printed circuits 410 and 510, a plurality of integrated circuit ("IC") chips 440 and 540, and printed circuits boards ("PCBs") 450 and 550.

Since the gate driver unit 400 and the data driver unit 500 are similar to each other, the structure of the gate driver unit 400 will be mainly described.

Referring to FIGS. 3 and 4, each IC chip 440 is respectively connected to the lower and upper thin film forms 150p and 150q of the thin film transistor array panel 100 through lower and upper flexible printed circuits 410a and 410b on the output side, and is connected to the printed circuit board 450 through one flexible printed circuit 410c. According to an exemplary embodiment, the flexible printed circuits 410a, 410b, and 410c may include a plurality of metal signal lines and a protection layer for protecting the metal signal lines.

One end of the lower flexible printed circuit 410a is connected to the lower surface of the thin film transistor array panel 100 corresponding to the lower display panel 200p in the lower output side, and one end of the upper flexible printed circuit 410b is connected to the upper surface of the thin film transistor array panel 100 corresponding to the upper display panel 200q in the upper output side. Anisotropic conductive films 430 are formed between the thin film transistor array panel 100 and the lower and upper flexible printed circuits 410a and 410b. The conductive particles included in the anisotropic conductive films 430 connect the metal signal lines of the lower and upper flexible printed circuits 410a and 410b to the signal lines of the thin film transistor array panel 100.

As shown in FIG. 3, according to an exemplary embodiment, the output terminals of each integrated circuit chip 440 are formed on the lower and upper surfaces of the integrated circuit chip 440, and the other ends of the lower and upper flexible printed circuits 410a and 410b on the output side are respectively connected to the output terminals formed on the lower and upper surfaces of the integrated circuit chip 440. The integrated circuit chip 440 receives the signals from the gate printed circuit board 450, and transmits the gate signals to the lower and upper flexible printed circuits 410a and 410b.

The integrated circuit chip 440 is connected to the gate printed circuit board 450 through the flexible printed circuit 410c on the input side. Also, the anisotropic conductive films 430 are formed between the flexible printed circuit 410c and the gate primed circuit board 450.

As shown in FIG. 4, according to another exemplary embodiment, the output terminal of the integrated circuit chip 440 is only formed on the upper surface of the integrated circuit chip 440. The other end of the upper flexible printed circuit 410b is connected to the output terminal formed on the upper surface of the integrated circuit chip 440, but the other end of the lower flexible printed circuit 410a is not connected to the integrated circuit chip 440, and is instead connected to the upper flexible printed circuit 410b. For this connection, a plurality of signal lines are formed on the lower surface of the upper flexible printed circuit 410b which transmits the electrical signals to the lower thin film form 150p.

The data driver unit 500, which is not shown in FIGS. 3 and 4, is somewhat similar to the gate driver unit 400. Thus, similar to the gate driver unit, as shown in FIG. 1, the data driver unit 500 includes a flexible printed circuit 510 which includes lower and upper flexible printed circuits 510a and 510b and a flexible printed circuit 510c and anisotropic conductive films 530 formed between the thin film transistor array panel 100 and the lower and upper flexible printed circuits 510a and 510b. According to an exemplary embodiment, at least one of the gate and data driver units 400, 500 may be omitted and the functions of the omitted portion may be added to the other driver.

As described above, one integrated circuit chip 440 and 540 may transmit the signals to the lower and upper thin film forms 150p and 150q of the thin film transistor array panel 100. Accordingly, it is not necessary that the integrated circuit chips are separately provided, such that the assembly process may be simplified and the time of the assembly process may be shortened.

Again referring to FIG. 1, the backlight assembly 340 is disposed under the display panel assembly 300, and the top chassis 60 is disposed on the display panel assembly 300. The display panel assembly 300 is safely fixed to the backlight assembly 340 by the top chassis 60.

According to an exemplary embodiment, the backlight assembly 340 includes a light source which generates light, a light guiding plate which guides the generated light and a reflecting sheet which reflects the generated light, and the light source may be made of cold cathode fluorescent lamps ("CCFL"), external electrode fluorescent lamps ("EEFL"), or light emitting diodes ("LED") for irradiating light having uniform brightness without relation to the display device 1. The light guiding plate guides the light incident from the light source, and the reflecting sheet reflects the light reflected by the light guiding plate toward the display panel assembly 300.

The viewing angles of the display device including a pair of display panel assemblies and the display device according to an exemplary embodiment of the present invention were measured in experiments, and will be described in detail with reference to FIGS. 5A and 5B.

FIGS. 5A and 5B are schematic views illustrating the viewing angle characteristics of a conventional display device including a pair of display panel assemblies and the display device according to an exemplary embodiment of the present invention.

FIG. 5A is a schematic view showing the liquid crystal display including a pair of display panel assemblies 30p and 30q. Since each of the display panel assemblies 30p and 30q includes lower panels 10*p* and 10*q* and upper panels 20*p* and 20*q*, the liquid crystal display includes a total of four panels 10*p*, 10*q*, 20*p*, and 20*q*.

FIG. 5B is a schematic view illustrating the display device according to the embodiment of the present invention. Since the display device according to an exemplary embodiment, includes one thin film transistor array panel 100, a lower display panel 200*p*, and an upper display panel 200*q*, the display device 1 includes a total of three panels 100, 200*p*, and 200*q*.

In these experiments, the width of the pixel is about 300 microns, the refraction ratio of the liquid crystal layer n1 is approximately 1.0, and the refraction ratios of the upper and lower substrates are approximately 1.5 and 2.

| Viewing angle | Thickness of the glass substrate t for n2 = 1.5 | Thickness of the glass substrate for n2 = 2.0 |
|---|---|---|
| 80° | ~345 μm | ~530 μm |
| 70° | ~373 μm | ~564 μm |
| 60° | ~424 μm | ~624 μm |

Referring to FIG. 5A, n1 sin θ1 is equal to n2 sin θ2, and tan θ2 is equal to 300/t. To obtain a viewing angle of 60 degrees, even though a glass substrate having a large refraction ratio of 2.0 is used, the total t of the two substrates between the two liquid crystal layers must be maintained to be less than 624 microns. However, because the thickness (approximately t/2) of one glass substrate is about 500 microns and so the thickness of the two glass substrates is about 1,000 microns when using the two substrates between the liquid crystal layers as shown in FIG. 5A, it is impossible that a wide enough viewing angle is gained.

However, even though the display device 1 according to the embodiment of the present invention includes the two liquid crystal layers, since the thin film transistor panel 100 includes two thin film forms 150*p* and 150*q* formed on both of its surfaces, the display device 1 according to the embodiment of the present invention includes a total of only three panels 100, 200*p*, and 200*q*. That is, as shown in FIG. 5B, because one substrate is disposed between the two liquid crystal layers, the thickness t of the substrate between the two liquid crystal layers may be maintained as approximately 500 microns. Accordingly, a viewing angle of more than 80 degrees may be gained when using the substrate having a 2.0 refraction ratio. Also, a viewing angle of 80 degrees may be gained when using a substrate having a 1.5 refraction ratio.

As a result, a wide viewing angle may be sufficiently obtained, as well as a high contrast ratio.

Now, a manufacturing method for a display device according to an exemplary embodiment of the present invention will be described in detail with reference to FIGS. 6 and 7 as well as FIGS. 1 through 5.

Figure 6:
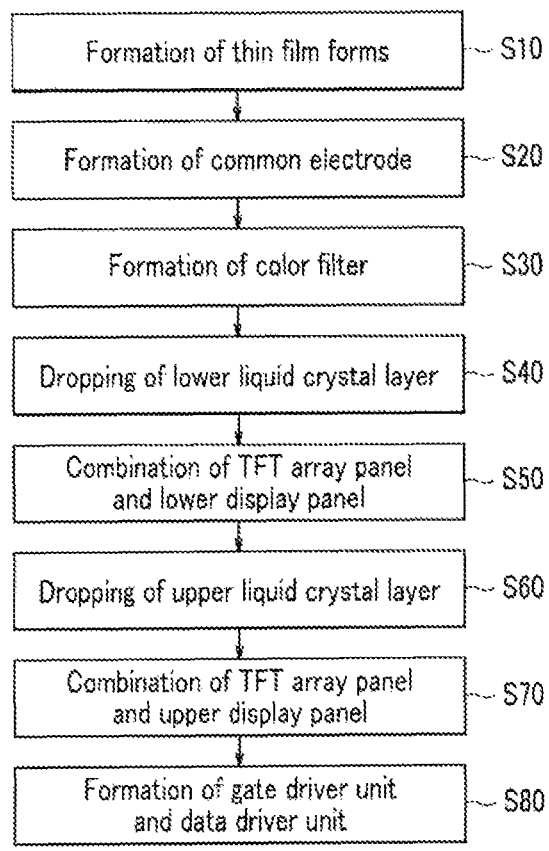
FIG. 6 is a flow chart illustrating an exemplary embodiment of a manufacturing method of the display device according to the present invention.
Figure 7:
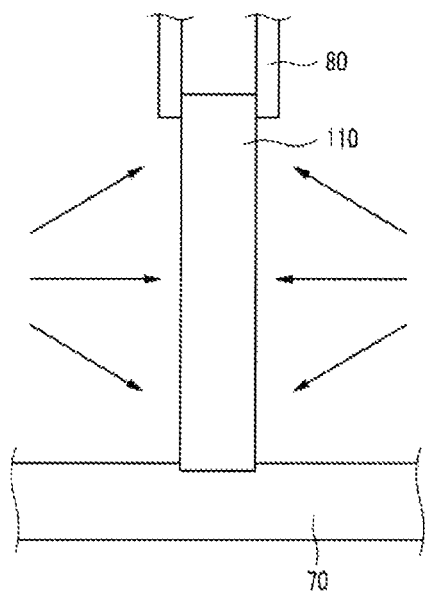
FIG. 7 is a view illustrating an exemplary embodiment of an operation for forming thin films on the substrate in the manufacturing method shown in FIG. 6, according to the present invention.

FIG. 6 is a flow chart illustrating an exemplary embodiment of the manufacturing method of the display device according to the present invention, and FIG. 7 is a view illustrating an exemplary embodiment of an operation of forming thin films on the substrate in the manufacturing method shown in FIG. 6, according to an exemplary embodiment of the present invention.

Referring to FIG. 6, a plurality of thin film forms 150*p* and 150*q* are respectively formed on the upper and lower surfaces of a substrate 110 (in operation 10). In detail a plurality of gate lines (not shown) including gate electrodes 124*p* and 124*q*, and a plurality of storage electrodes 133*p* and 133*q* are respectively formed on the upper and lower surfaces of the substrate 11, and gate insulating layers 140*p* and 140*q*, a plurality of semiconductors 154*p* and 154*q*, and a plurality of ohmic contacts 163*p*, 163*q*, 165*p*, and 165*q* are sequentially formed thereon. A plurality of data lines 171*p* and 171*q* including source electrodes 173*p* and 173*q* and end portions (not shown), and a plurality of drain electrodes 173*p* and 175*q* are formed thereon, and passivation layers 180*p* and 180*q* made of an insulator such as an organic insulating material having flatness and photosensitivity are respectively formed on the data lines 171*p* and 171*q*, the drain electrodes 175*p* and 175*q*, the gate insulating layers 140*p* and 140*q*, and the exposed portions of the semiconductors 154. A plurality of contact holes 185*p* and 185*q* are formed in the passivation layers 180*p* and 180*q*, and a plurality of pixel electrodes 191*p* and 191*q* respectively connected to the drain electrodes 173*p* and 173*q* through the contact holes 185*p* and 185*q* are respectively formed on the passivation layers 180*p* and 180*q*. An upper polarizer 12 is formed on the upper surface of the pixel electrodes 191*q* and the passivation layer 180*q* to complete a thin film transistor array panel 100.

In the manufacturing method of the thin film transistor array panel 100, the thin film form 180*p* is firstly formed on the lower surface of the substrate 110 and then the thin film form 150*q* is secondly formed on the upper surface of the substrate 110. According to an exemplary embodiment, as shown in FIG. 7, the substrate 110 is fixed by the supporting member 70 and 80, and the thin film forms 150*p* and 150*q* are simultaneously formed on She upper and lower surfaces of the substrate 110 such that the cost of the manufacturing process may be decreased.

In the manufacturing method of lower and upper display panels 200*p* and 200*q*, first, light blocking members 220*p* and 220*q* and overcoats 250*p* and 250*q* are respectively formed on insulating substrates 210*p* and 210*q*. Next, common electrodes 270*p* and 270*q* are formed thereon (operation 20). According to an exemplary embodiment, when forming the upper display panel 200*p*, color filters 230 may be additionally formed (operation 30).

Next, a liquid crystal material is dropped on the thin film transistor array panel 100 or the lower display panel 200*p* to form a lower liquid crystal layer 3*p* (operation 40). When using the dropping method, the time for the manufacturing process may be decreased in comparison with a vacuum injection method executed after the assembly of the panels 100, 200*p*, and 200*q*. Next, the thin film transistor array panel 100 and the lower display panel 200*p* are aligned and combined, and the lower liquid crystal layer 3*p* is formed (operation 50).

Next, a liquid crystal material is dropped on the thin film transistor array panel 100 or the upper display panel 200*q* to form an upper liquid crystal layer 3*q* (operation 60). Then, the thin film transistor array panel 100 and the upper display panel 200*q* are aligned and combined, and the upper liquid crystal layer 3*q* is formed (operation 70).

Next, a gate driver unit 400 and a data driver unit 500 are electrically connected to signal lines formed in the thin film transistor array panel 100 to form a liquid crystal panel assembly 300 (operation 80).

Then, the liquid crystal panel assembly 300 is combined to a backlight assembly 340 and a top chassis 60 to form a liquid crystal display.

In the current exemplary embodiment, a dropping method whereby the liquid crystal material is dropped onto the panels to form the lower and upper liquid crystal layers 3*p* and 3*q* is used. However, according to another exemplary embodiment, a vacuum injection method whereby the liquid crystal material is injected in between the panels after the assembly of the panels 100, 200p, and 200q may be used.

As described above, the thin film forms 150p and 150q, are formed on both sides of the substrate 110 and liquid crystal layers 3p and 3q are formed on both sides of the thin film transistor array panel 100. Accordingly, the contrast ratio of the display device 1 may be improved as well as giving a wide viewing angle.

Furthermore, according to an exemplary embodiment, it is not necessary that the integrated circuit chips that are formed on both surfaces of the substrate 110 are additionally formed, and accordingly the assembly process of the display device may be simplified.

While the present invention has been shown and described with reference to some exemplary embodiments thereof, it should by understood by those of ordinary skill in the art that various changes in form and details may be made therein without departing from the spirit and scope of the present invention as defined by the appended claims.

What is claimed is:

1. A thin film transistor array panel, comprising:
   an insulating substrate having a first surface and a second surface opposite to the first surface, the first surface and the second surface each defining substantially planar surfaces;
   a first thin film form disposed directly on the first surface, the first thin film form including a first thin film transistor and a first electrode; and
   a second thin film form disposed directly on the second surface, the second thin film form including a second thin film transistor and a second electrode,
   wherein the first thin film form and the second thin film form are symmetrical with respect to the insulating substrate, and
   wherein a polarizer and a color filter are only included in one side of the insulating substrate.

2. The thin film transistor array panel of claim 1, wherein the first thin film form and the second thin film form respectively comprise:
   a gate electrode;
   a gate insulating layer covering the gate electrode;
   a semiconductor layer formed on the gate insulating layer;
   a source electrode formed on the semiconductor layer; and
   a drain electrode formed on the semiconductor layer and separated from the source electrode.

3. The thin film transistor array panel of claim 2, wherein the first thin film form further comprises a passivation layer formed on the semiconductor layer and the polarizer formed on the passivation layer which polarizes incident light.

4. The thin film transistor array panel of claim 3, wherein the first electrode is disposed between the passivation layer and the polarizer, and the first electrode is connected to the drain electrode.

5. The thin film transistor array panel of claim 1, wherein the polarizer polarizes incident light.

6. The thin film transistor array panel of claim 5, wherein the polarizer comprises a lattice pattern of minute lines.

7. The thin film transistor array panel of claim 1, wherein the first surface and the second surface define the insulating substrate having substantially a same thickness along an entire length of the insulating substrate.

8. A display device, comprising:
   a first insulating substrate having a first surface and a second surface opposite to the first surface, the first surface and the second surface each defining substantially planar surfaces;
   a first thin film form disposed directly on the first surface, the first thin film form including a first thin film transistor;
   a second thin film form disposed directly on the second surface, the second film form including a second thin film transistor;
   a second insulating substrate facing the first thin film form; and
   a third insulating substrate facing the second thin film form,
   wherein the first thin film form and the second thin film form are symmetrical with respect to the first insulating substrate, and
   wherein a polarizer and a color filter are only included in one side of the first insulating substrate.

9. The display device of claim 8, wherein the first thin film form and the second thin film form respectively comprise:
   a gate electrode;
   a gate insulating layer covering the gate electrode;
   a semiconductor layer formed on the gate insulating layer;
   a source electrode formed on the semiconductor layer; and
   a drain electrode formed on the semiconductor layer and separated from the source electrode.

10. The display device of claim 8, wherein the polarizer includes a lattice pattern of minute lines and which polarizes incident light.

11. The display device of claim 8, further comprising:
    a first common electrode and a second common electrode respectively formed on the second insulating substrate and the third insulating substrate.

12. The display device of claim 11, further comprising:
    a color filter formed on the third insulating substrate which displays color.

13. The display device of claim 8, further comprising:
    a first liquid crystal layer and a second liquid crystal layer respectively formed between the first insulating substrate and the second insulating substrate, and between the first insulating substrate and the third insulating substrate.

14. The display device of claim 8, further comprising:
    a first flexible printed circuit and a second flexible printed circuit respectively attached to the first surface and the second surface of the first insulating substrate; and
    an integrated circuit chip connected to the first flexible printed circuit and the second flexible printed circuit.

15. The display device of claim 8, further comprising:
    a first flexible printed circuit attached to the first surface of the first insulating substrate;
    a second flexible printed circuit attached to the second surface of the first insulating substrate and connected to the first flexible printed circuit; and
    an integrated circuit chip connected to the first flexible printed circuit.

16. The display device of claim 8, wherein the first surface and the second surface define the insulating substrate having substantially a same thickness along an entire length of the insulating substrate.

17. A display device comprising:
    a thin film transistor array panel comprising:
        an insulating substrate having a first surface and a second surface opposite to the first surface, the first surface and the second surface each defining substantially planar surfaces, and
        a plurality of forms respectively disposed directly on the first surface and the second surface of the insulating substrate, the forms including a thin film transistor;

a plurality of liquid crystal layers disposed on each side of the thin film transistor array panel; and a first display panel and a second display panel respectively disposed on a side of each of the liquid crystal layers, wherein one of the forms and another of the forms are symmetrical with respect to the insulating substrate, and wherein a polarizer and a color filter are only included in one side of the insulating substrate.

18. The display device of claim 17, wherein a thickness of the insulating substrate is maintained at approximately 500 microns.

19. The display device of claim 17, further comprising a first flexible printed circuit and a second flexible printed circuit respectively connected to the first surface and the second surface of the insulating substrate, the second flexible printed circuit connected with the first flexible printed circuit; and an integrated chip having an output terminal which is only connected with the first flexible printed circuit.

20. The display device of claim 17, wherein the first surface and the second surface define the insulating substrate having substantially a same thickness along an entire length of the insulating substrate.

\* \* \* \* \*